United States Patent [19]

Boutros

[11] 4,260,966

[45] Apr. 7, 1981

[54] HIGH CURRENT FILTER CONNECTOR WITH REMOVABLE CONTACT MEMBERS

[75] Inventor: Kamal S. Boutros, Downsview, Canada

[73] Assignee: Bunker Ramo Corporation, Oak Brook, Ill.

[21] Appl. No.: 863,774

[22] Filed: Dec. 23, 1977

[51] Int. Cl.[3] ...................... H03H 7/01; H01R 19/22; H01R 19/42; H01R 19/46

[52] U.S. Cl. .................................. 333/182; 333/184; 333/185; 339/147 R

[58] Field of Search ............... 333/182, 184, 185, 183, 333/206, 245, 260; 339/147 R, 143 R, 147 P; 361/302, 306, 313, 328

[56] References Cited

U.S. PATENT DOCUMENTS

| | | | |
|---|---|---|---|
| 3,002,162 | 9/1961 | Garstang | 333/183 X |
| 3,200,355 | 8/1965 | Dahlen | 333/79 |
| 3,320,557 | 5/1967 | Garstang | 333/79 |
| 3,435,387 | 3/1969 | Reinke et al. | 339/147 R |
| 3,447,104 | 5/1969 | Schor | 333/183 |
| 3,535,676 | 10/1970 | Schultz, Sr. | 339/143 |
| 3,539,973 | 11/1970 | Antes et al. | 339/143 |
| 3,582,862 | 6/1971 | Anderson | 339/14 |
| 3,588,758 | 4/1969 | Hurst | 333/79 |
| 3,710,285 | 1/1973 | Schor et al. | 339/147 |
| 3,721,869 | 3/1973 | Paoli | 317/256 |
| 3,743,979 | 7/1973 | Schor | 333/182 X |
| 3,787,607 | 1/1974 | Schlafly | 29/628 |
| 3,825,874 | 7/1974 | Peverill | 339/14 |
| 3,840,841 | 10/1974 | Clark | 339/147 |
| 3,854,107 | 12/1974 | Tuchto et al. | 339/147 |
| 3,961,294 | 6/1976 | Hollyday | 339/143 |
| 4,029,386 | 6/1977 | Krantz, Jr. et al. | 339/143 R |
| 4,126,370 | 11/1978 | Nijman | 339/143 R |

FOREIGN PATENT DOCUMENTS

| | | |
|---|---|---|
| 2140624 | 1/1973 | France . |
| 2297503 | 6/1976 | France . |
| 1015523 | 1/1966 | United Kingdom . |
| 1254898 | 11/1971 | United Kingdom . |
| 1338755 | 11/1973 | United Kingdom . |
| 1443582 | 7/1976 | United Kingdom . |

*Primary Examiner*—Marvin L. Nussbaum

*Attorney, Agent, or Firm*—F. M. Arbuckle; T. J. Haller

[57] ABSTRACT

A filter connector which is capable of conducting high RF currents and which affords removal of its contact members without damage to its filter networks includes an outer metallic shell, an inner body within the shell having a plurality of through channels, a ground plate, a hollow tubular filter network in each channel, and a contact member within each network. Each filter network comprises a plurality of tubular filter elements which are axially aligned, contiguous, and adhere together, an outer conductive coating covering an external portion of at least one of the elements forming a ground electrode and an inner conductive coating on the interior surface of at least one of the elements forming a pin electrode. The filter networks are fixed to the ground plate which is of substantial width dimension to accommodate high RF currents and dissipate the heat generated thereby and for being closely adjacent the filter ground electrodes for coupling thereto. The contact members are adapted for insertion into and ready removal from the filter networks and include contact portions for contacting the filter pin electrodes. The network elements may be varied in number, kind, and relative axial positions to derive many different filter types, as illustrated in the preferred embodiments.

25 Claims, 5 Drawing Figures

HIGH CURRENT FILTER CONNECTOR WITH REMOVABLE CONTACT MEMBERS

BACKGROUND OF THE INVENTION

The present invention is directed generally to electrical connectors of a type providing protection from electromagnetic interference (EMI). More particularly, the invention is directed to a multiple contact filter connector capable of conducting high RF currents and which includes improved filter network and contact assemblies which provide a full range of EMI protection while accommodating a high density contact array and allowing the contacts to be readily inserted into and removed from the connector.

In numerous applications where long unshielded cable runs enter a shielded housing containing circuitry sensitive to extraneous signals picked up by the cable, it is necessary to provide electrical filter networks as an integral part of a connector to suppress transient and other undesired signals, such as EMI, which may otherwise exist on circuits interconnected by the connector. An illustrative prior art filter connector used in such applications is shown and described in Tuchto et al, U.S. Pat. No. 3,854,107, assigned to the same assignee as the present invention.

The filter connector illustrated in the aforementioned Tuchto et al patent includes a dielectric body having a plurality of through bores, a like plurality of filter contacts supported within the bores, and a thin conductive foil ground plate. Each filter contact includes a filter network comprising multiple concentric filter elements coaxially disposed about a reduced diameter portion of the contact and a ground electrode outer coating forming a pi network filter. The bores and filter contacts are so dimensioned that the contacts may be inserted into and removed from the bores with the ground electrodes contacting the thin foil ground plate through wiping action.

While multiple contact filter connectors of the foregoing variety have proven successful when used to conduct relatively low RF currents of approximately one-quarter ampere, they have not been suitable for conducting high RF currents of, for example, three amperes, because the ground plates are thin. The thin ground plates cannot adequately dissipate the extreme heat generated by high current conduction, causing the connectors to overheat and, ultimately, fail. Additionally, since the filter networks and contacts are integral units, there is always the possibility of damage to the rather fragile networks during removal and insertion of the contacts. Lastly, full range EMI protection is not possible due to the inherent low filter capacitance afforded by the multiple coaxial layer network construction. To increase the filter capacitance, it would be necessary to lengthen the contacts, and thus the connector, to such an extent as to limit the useful applications.

SUMMARY OF THE INVENTION

It is therefore a primary aspect of the present invention to provide a new and improved filter connector which is capable of conducting high RF currents.

It is another aspect of the present invention to provide a high current filter connector having a length dimension which does not limit the applications of the connector but which provides sufficient filter capacitance to afford wide range EMI protection.

It is a still further aspect of the invention to provide a multiple contact filter connector wherein the possibility of damaging the filter networks during installation or removal of the individual contacts is greatly reduced.

Accordingly, the invention is generally directed, in one of its broader aspects, to a filter connector including an outer shell formed from conductive material, an inner body including at least one channel therethrough, and a filter network within the channel comprising a plurality of axially aligned and contiguous tubular filter elements, an inner conductive coating on the interior surface of at least one of the tubular filter elements, and an outer conductive coating covering an outer surface portion of at least one of the tubular filter elements. The filter connector also includes a ground plate electrically coupled to the shell and also fixed to and electrically coupled to the outer conductive coating and a contact member within the hollow tubular filter network electrically coupled to the inner conductive coating. Other aspects of the invention are defined in detail in the accompanying claims and description of the preferred embodiments.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENTS

Figure 1:
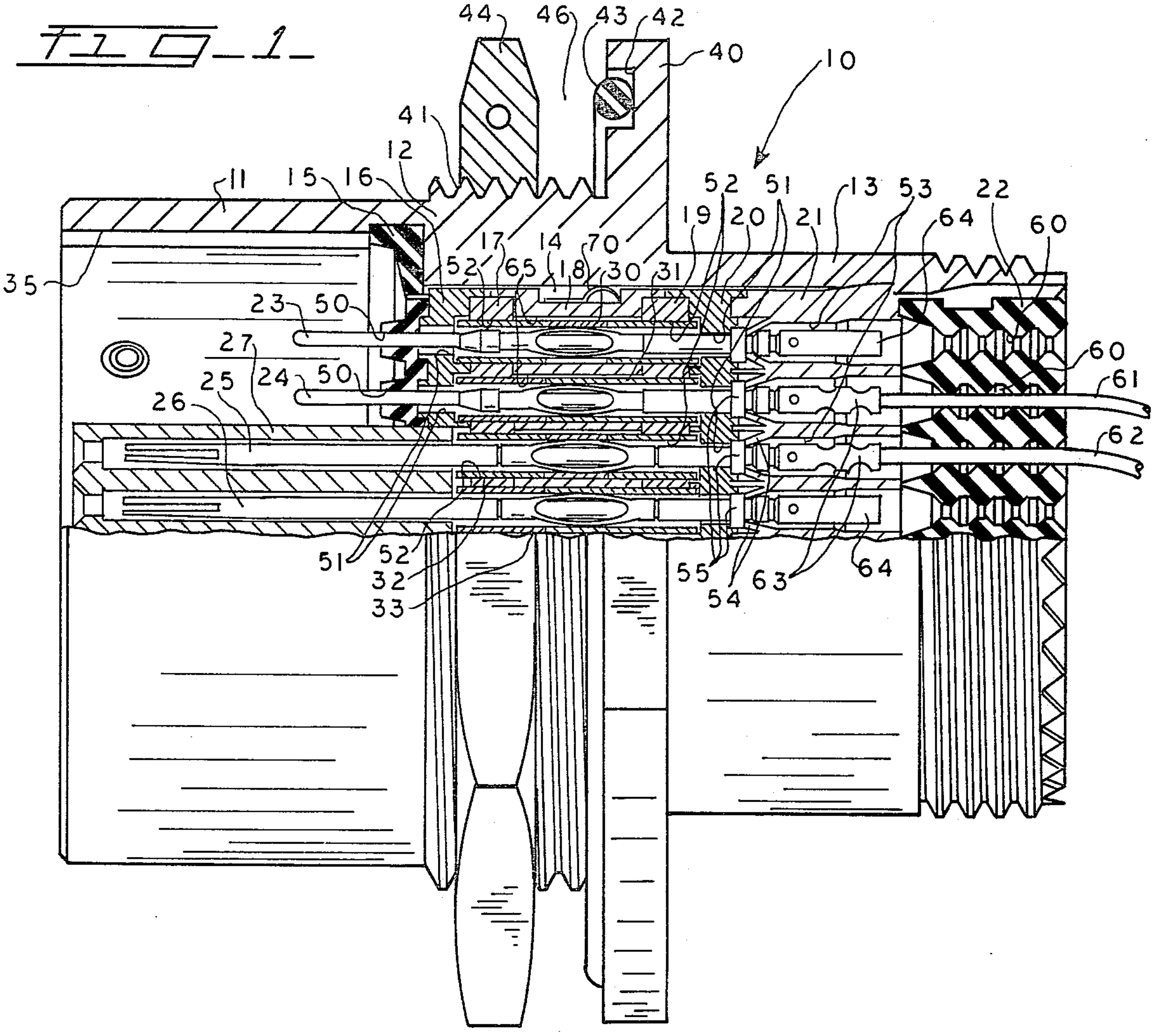
FIG. 1 is a side plan view, partially in cross-section, of a multiple contact filter connector embodying the present invention which illustrates various filter network and associated contact embodiments of the present invention.

Referring initially to FIG. 1, there is illustrated a multiple contact filter connector 10 which embodies the present invention. The filter connector 10 generally includes an outer metallic electrically conductive shell comprising a forward section 11, a middle section 12, and a rear section 13, an inner body comprising a plurality of laminant inserts 15, 16, 17, 18, 19, 20, 21 and 22, and a plurality of contact members comprising pin contacts 23 and 24 and socket contacts 25 and 26. The two different types of contacts, i.e., the pin contacts and socket contacts, are shown in FIG. 1 to illustrate that either type of contact may be utilized in a connector embodying the present invention. Of course, in the usual case, the connector 10 will include only one type of contact. Additionally, as illustrated in FIG. 1, when the socket contacts 25 and 26 are employed within the connector, a forward insert 27 is provided in place of inserts 15 and 16. Also illustrated in FIG. 1 are two of the many different varieties of filter networks which may be constructed in accordance with the present invention. The networks shown in FIG. 1 comprise pi filters 30 and 32 associated with pin contact 23 and socket contact 25, respectively, and L filters 31 and 33 associated with pin contact 24 and socket contact 26, respectively.

The section 11 of the connector comprises the forward mating end of the connector which is adapted to mate with a complementary connector. The forward section 11 includes an inner shell surface 35 which is adapted to receive a complementary mating connector forward end having a plurality of socket contacts for contacting the pin contacts 23 and 24. When the socket contacts 25 and 26 are employed, the shell 35 contains the forward insert 27 which carries the socket contacts. Hence, the socket contacts 25 and 26 disposed within the insert 27 are adapted to mate with a complementary connector having a plurality of pin contacts.

The middle section 12 of the shell includes a circumferential, radially extending flange 40 and an external thread 41. The flange 40 includes a circumferential slot 42 which is dimensioned for receiving a resilient O-ring member 43. The external thread 41 carries a nut 44 which is utilized for securing the connector 10 to a support surface, such as a bulkhead for example. In use, the connector 10 is inserted through a suitably dimensioned aperture in a bulkhead and then the nut 44 is threaded onto the external threads 41 so that the bulkhead is disposed between the resilient O-ring 43 and nut 44 in the space indicated at 46, thereby supporting the connector 10.

The laminant inserts each include a plurality of through bores which are aligned when inserted into the shell to form a plurality of through channels. The channels include portions dimensioned for receiving the contacts 23 through 26, and the filter networks 30 through 33.

The most forward insert 15 associated with employment of pin contacts 23 and 24 forms a forward face seal and includes through bores 50 which are dimensioned for receiving the forward ends of the pin contacts 23 and 24. The face seal 15 is preferably formed from a rigid plastic material.

Inserts 16 and 20 include a plurality of through bores 51 which are of greater dimension than the pin contacts 23 and 24 and are also preferably formed from a plastic material. Inserts 17 and 19 are preferably formed from a resilient material, such as rubber, and include a plurality of through bores 52 which are dimensioned for receiving the filter networks 30 through 33. Insert 21 is formed from a plastic material and includes a plurality of through bores 53 which are greater in dimension than the maximum diameter dimension of the contacts 23 through 26 to allow the contacts to be inserted into the connector. Each of the bores 53 includes a pair of tines 54 of conventional configuration which abut circumferential flanges 55 carried by the contacts 23 through 26 to retain the contacts within the connector channels. As well known in the art, removal of the contacts may be accomplished with a suitable sleeve-like tool which forces the tines 54 in a radial direction out of engagement with flanges 55 to allow the contacts to be removed from the rear end of the connector.

The most rearward insert 22 forms a rear grommet for the connector 10. It is formed from a resilient material, such as rubber, and includes a plurality of through bores 60. The bores 60 have corrugated inner surfaces which contact the insulated conductors 61 and 62 to provide a seal between the conductors and the rear end of the connector.

The contacts 23 through 26, as illustrated, include two different varieties of terminating ends for terminating conductors to the contacts. Pin contact 24 and socket contact 25 include crimp-type terminating ends 63 which are crimped to the conductors. Pin contact 23 and socket contact 26 include socket type terminating ends 64 which are adapted for receiving mating terminating pins carried by conductors (not shown) to be connected to the contacts 23 and 26.

Insert 18 is constructed from metal and forms the conductive ground plate of the connector. It includes a slot 14 adjacent the shell middle section 12 and is electrically coupled to the metallic shell by a leaf spring 70. The ground plate 18 is of substantial width, for reasons to be more fully explained hereinafter, and includes a plurality of through bores 65 which are slightly greater in dimension than the dimension of the filter networks 30 through 33.

Figure 2:
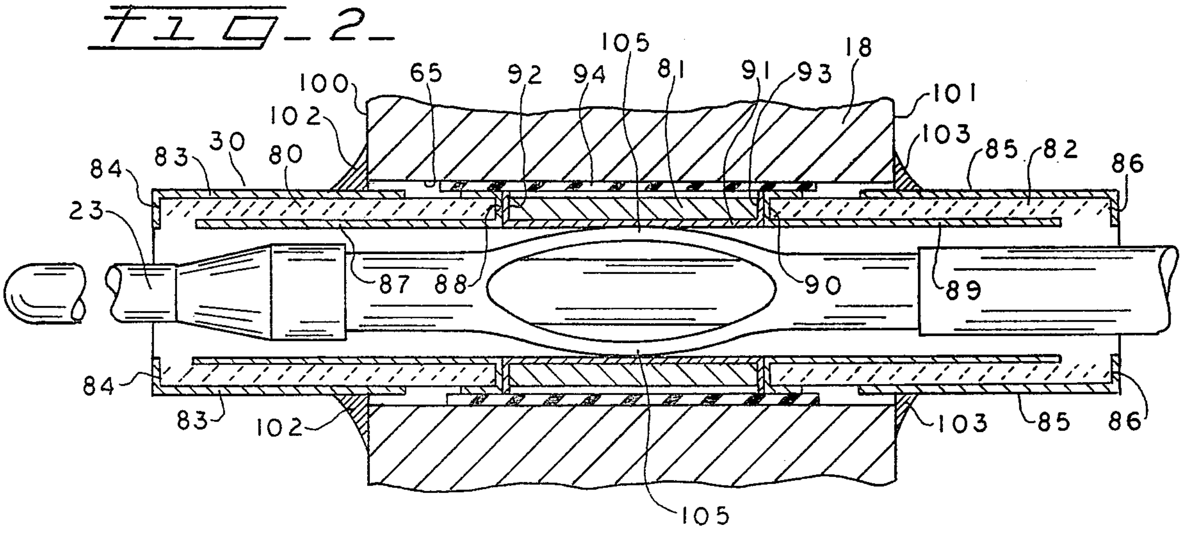
FIG. 2 is a partial cross-sectional view, to an enlarged scale, illustrating a pi network filter and ground plate constructed in accordance with one aspect of the present invention.
Figure 3:
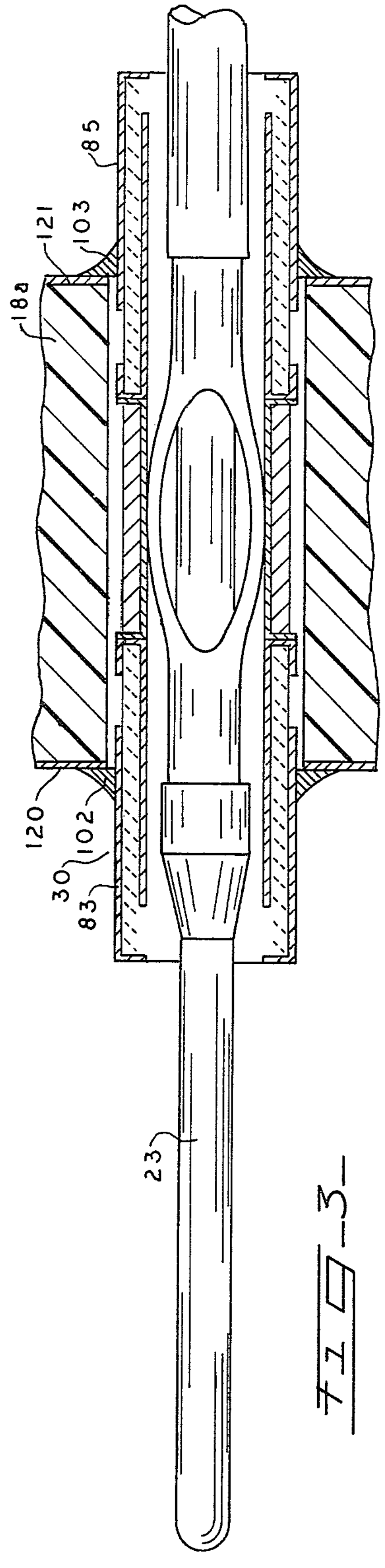
FIG. 3 is a partial cross-sectional view, to an enlarged scale, illustrating a pi network filter and ground plate constructed in accordance with another aspect of the present invention.
Figure 4:
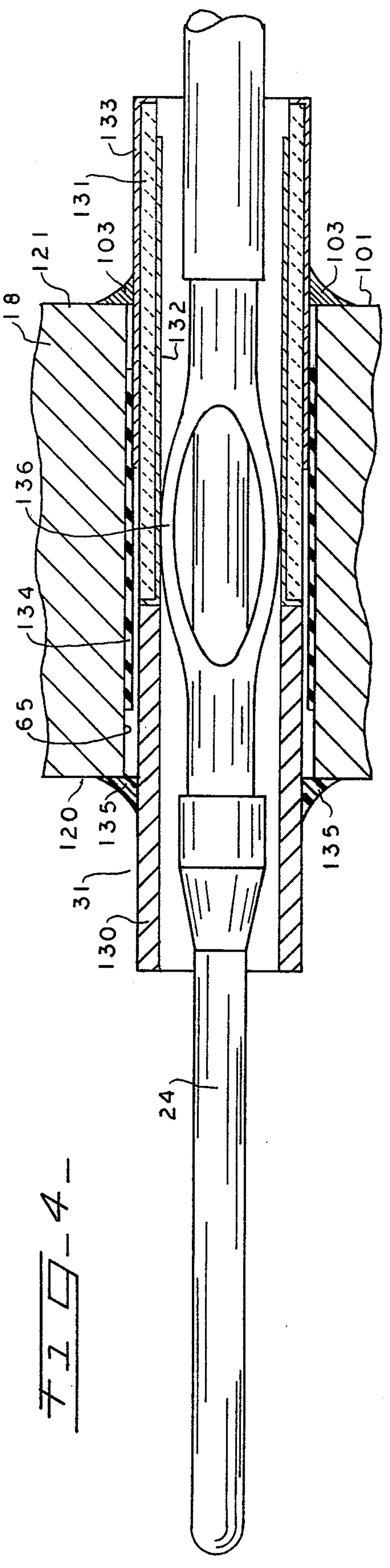
FIG. 4 is a partial cross-sectional view, to an enlarged scale, illustrating an L network filter and ground plate constructed in accordance with a still further aspect of the present invention.

FIGS. 2 through 4 show in detail various forms of filter networks which may be constructed in accordance with the present invention. For convenience, like reference numerals will be repeated in FIGS. 2 through 4 when identifying corresponding elements appearing in FIG. 1.

Referring now specifically to FIG. 2, a pi network filter 30 is illustrated in association with the ground plate 18 and the pin contact 23. The pi network 30 comprises a plurality of axially aligned and contiguous tubular elements 80, 81 and 82. The filter elements comprise a pair of end capacitance filter elements 80 and 82 and a center ferrite or inductive filter element 81.

Capacitance filter element 80 includes an outer conductive coating 83 which extends over its forward end 84 to form a ground electrode of the filter. In a similar manner, filter element 82 includes an outer conductive coating 85 which extends over its rear surface 86 to form another ground electrode. Filter element 80 also includes an inner conductive coating 87 on its inner surface which extends over its rear surface 88 and in a similar manner, filter element 82 includes an inner conductive coating 89 which extends over its forward end surface 90.

The ferrite filter element 81 includes an inner conductive coating 91 over its inner surface to form the pin electrode of the filter. The conductive coating 91 also extends over the forward and rear surfaces 92 and 93 respectively of the ferrite filter element 81 as shown. An insulating sleeve 94 surrounds the filter network and completely covers the ferrite filter element 81 to insulate the pin electrode comprising the inner conductive coatings 87, 91 and 89 and the ferrite filter element 81 from the ground plate 18.

The filter elements 80, 81 and 82 may be adhesively joined with conductive epoxy to electrically couple together the inner conductive coatings 87, 91 and 89. Also, the ground plate 18 is of substantial width dimension, having a width dimension greater than the axial length of ferrite filter element 81. As a result, its major planar surfaces 100 and 101 are closely adjacent the ground electrode outer conductive coatings 83 and 85 respectively. The filter network 30 is fixed within the through bores 62 of ground plate 18 and the ground electrodes outer conductive coatings 83 and 85 are electrically coupled to the ground plate by conductive epoxy or solder at junctures 102 and 103. As a result of this construction, an equivalent pi network filter is formed.

The pin contact 23 includes intermediate its ends, a radially extending spring contact portion 105 for contacting the pin electrode inner conductive coating 91 of the filter when it is assembled in final position within the connector. As a result, any extraneous EMI interference resident in pin contact 23 will be filtered to ground by the pi network filter thus formed. Because the ground plate 18 is of substantial width dimension, such as one-quarter inch, high RF currents may be conducted by pin contact 23 without excessive heating of the connector. The substantial mass of ground plate 18 serves to dissipate the heat which is formed during such high RF current conduction. Also, because the filter network 30 is fixed within the connector body, and because the pin contact 23 may be easily inserted into and removed from the connector in the manner as previously described, the removal or insertion of the pin contact 23 may be effected with little possibility of damaging the network filter.

Figure 5:
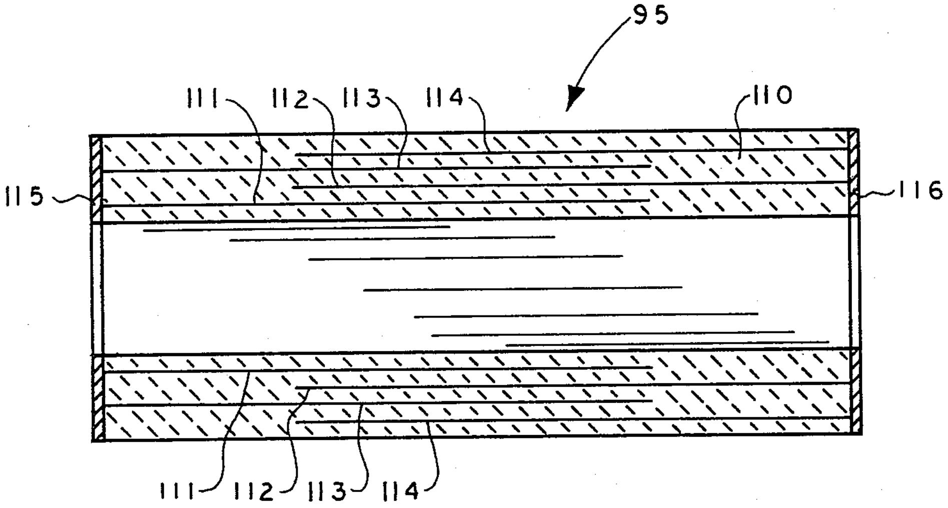
FIG. 5 is a cross-sectional view, to an enlarged scale, illustrating a capacitor filter element which may be utilized in practicing the present invention.

The capacitance filter elements 80 and 82 are preferably of the type as illustrated in FIG. 5 which comprises a multi-layer capacitance filter element. Referring now specifically to FIG. 5, the capacitance filter element 95 there shown comprises a tubular body 110 formed from a suitable dielectric ceramic material. Coaxially disposed within the body 110 are a plurality of radially spaced interleaving plates 111 through 114. Plates 111 and 113 are connected in common by an end coating of conductive material 115 and plates 112 and 114 are connected in common by an end conductive coating 116. The regions in which the various plates overlap form the plates of capacitors which combine in parallel to provide a high filter capacitance. Of course, the amount of capacitance provided by the capacitance element is dependent upon the area of overlap and spacing between the plates, the number of plates, and the dielectric constant of the ceramic material. It can thus be appreciated that the capacitance element 95 of FIG. 5 is shown to include four capacitance plates for illustrative purposes only.

By utilizing the multilayered variety of filter capacitance element illustrated in FIG. 5 for the capacitance filter elements 80 and 82, the filter network of FIG. 2 will have sufficient filter capacitance to provide wide range EMI protection. Such wide range EMI protection is obtained without increasing the length dimension of the filter network to a point which limits its useful applications.

Referring now to FIG. 3, it illustrates the pi network filter 30 and pin contact 23 as illustrated in FIG. 2 in association with a ground plate 18*a* of modified construction. The ground plate 18*a* of FIG. 3 is formed from insulating material and includes on its major planar surfaces condjctive coatings 120 and 121. Ground plate coating 120 is electrically coupled to the outer conductive coating 83 by the electrically conductive epoxy 102 and in a similar manner, coating 121 is electrically coupled to the outer conductive coating 85 by conductive epoxy 103. As a result, the network 30 is fixed within the ground plate 18*a*.

Although a filter connector constructed in accordance with this aspect of the present invention is not suitable for conducting high RF currents, it does provide all of the advantages of the filter network assembly of FIG. 2 in that it provides a wide range of EMI protection and also provides removal and insertion of the pin contact 23 without the possibility of damaging the filter network 30.

Referring now to FIG. 4, it illustrates an L-type filter network which may also be constructed by practicing the present invention. It also utilizes the ground plate 18 of substantial width dimension and thus is suitable for conducting high RF currents. The L network 31 comprises a tubular inductive filter element 130 and a tubular capacitance filter element 131 which may be of the type previously referred to with respect to FIG. 5. The capacitance filter element 131 has on its inner surface a conductive coating 132 forming the filter pin electrode and an outer conductive coating 133 which forms the filter ground electrode. An insulating sleeve 134 is also provided about the filter network 31 to insure isolation between the ferrite filter element 130 and the ground plate 118. The outer coating 133 is electrically coupled to the ground plate 18 at its major planar surface 101 by conductive epoxy 103. The epoxy 103 also fixes the filter network 31 within the through bore 65 of the ground plate 18. At the forward major surface 102 of the ground plate 18, the filter network is also fixed to the ground plate by non-conductive epoxy 135. The pin contact 24 includes intermediate its ends an outer spring contact 136 which contacts the pin electrode 132 formed by the inner conductive coating 132.

The L filter network provided by the construction shown in FIG. 4 also provides a wide range of EMI protection by virtue of the sufficiently high capacitance provided by the capacitance filter element 131. Additionally, because the filter network is fixed within the through bore 65 of ground plate 18, the pin contact 24 may be removed from the filter and inserted into the filter without damaging the network filter. Also, by virtue of the fact that the ground plate 18 is of substantial width dimension, the pin contact 24 is capable of conducting high RF currents without excessive heating.

While the embodiments of FIGS. 2 through 4 illustrate two different types of filter networks, namemly, a pi network filter and an L network filter, those skilled in the art will appreciate that the various filter elements may be varied in kind, number, and relative axial positions to derive many different other varieties of network filters without departing from the present invention. Additionally, although the preferred embodiments have shown and described contact members having outer spring contacts for contacting the pin electrodes of the filters, it can be appreciated that other pin contact constructions which provide external contact may be utilized without departing from the present invention.

From the foregoing, it can be seen that the present invention provides a new and improved multiple contact filter connector. The filter connector of the present invention, by virtue of its ground plate of substantial width dimension, is capable of conducting high RF currents of three amperes. Because of the substantial mass of the ground plate, the ground plate serves to dissipate the heat generated as a result of high current conduction which has not been possible with prior art constructions. Furthermore, the present invention provides a filter connector which has sufficiently high filter capacitance so as to provide a wide range of EMI protection without increasing the length of the connector to the point that its useful applications are limited. Lastly, the filter connector of the present invention avoids damage to the fragile filter networks as its contact members are removed from and inserted into the connector.

While specific embodiments of the present invention have been shown and described, it will be appreciated by those skilled in the art that modifications may be made, and it is intended to cover all such changes and modifications which fall within the true spirit and scope of the present invention.

I claim:

1. A filter connector comprising:
- an outer shell formed from conductive material;
- an inner body including at least one channel therethrough;
- a filter network within said one channel comprising a plurality of axially aligned and contiguous tubular filter elements, an inner conductive coating on the interior surface of at least one of said tubular filter elements, and an outer conductive coating covering an outer surface portion of at least one of said tubular filter elements;
- a ground plate electrically coupled to said shell and also fixed to and electrically coupled to said outer conductive coating with the width of said ground plate taken parallel to the axes of said filter elements being of a magnitude at least as great as the axial length of any one of said tubular filter elements, said ground plate dissipating heat generated by high RF currents associated with said connector; and
- a contact member within said filter network electrically coupled to said inner conductive coating.

2. A filter connector as defined in claim 1 wherein said ground plate comprises a plate of non-conductive material having a pair of major planar surfaces and a conductive coating on at least one of said major surfaces coupled to said outer shell.

3. A filter connector as defined in claim 1 wherein said filter network comprises three filter elements including a center filter element and a pair of end filter elements.

4. A filter connector as defined in claim 1 wherein said filter network comprises a pair of filter elements, one of said filter elements being a ferrite element and the other said element being a capacitance filter element.

5. A filter connector as defined in claim 4 wherein said capacitance filter element includes said outer conductive coating and said inner conductive coating.

6. A filter connector adapted for conducting high RF currents comprising:
- an outer shell formed from conductive material;
- an inner body within said shell including at least one channel therethrough;
- a filter network within said one channel comprising a plurality of tubular filter elements including a center filter element and a pair of end filter elements, said elements being contiguous and axially aligned, an inner conductive coating on the interior surface of at least one of said filter elements and an outer conductive coating on the external surface of at least one of said filter elements;
- a conductive ground plate having at least one aperture forming a portion of said channel, said ground plate having a pair of major surfaces and a substantial width dimension between said major surfaces for disposing at least one of said major surfaces closely adjacent said outer conductive coating, said ground plate being electrically coupled to said shell and fixed to and electrically coupled to said outer conductive coating at said one major surface;
- an outer insulating sleeve surrounding said network for insulating at least one of said elements from said ground plate; and
- a contact member within said hollow tubular filter network electrically coupled to said inner conductive coating.

7. A filter connector as defined in claim 6 wherein said insulating sleeve insulates said center element from said ground plate.

8. A filter connector as defined in claim 7 wherein said center element comprises a ferrite filter element and wherein said end elements each comprise a capacitance filter element.

9. A filter connector as defined in claim 8 wherein the interior surfaces of each said element includes said inner conductive coating.

10. A filter connector as defined in claim 9 wherein each said end element includes an outer conductive coating and wherein each said outer coating is electrically coupled to a given one of said ground plate major surfaces.

11. A filter connector as defined in claim 10 wherein each said capacitance filter element comprises a multilayer capacitance element.

12. A filter connector as defined in claim 11 wherein said contact member includes an integral outer spring portion for contacting said inner conductive coating.

13. A filter connector adapted for conducting high RF currents comprising:
- an outer shell formed from conductive material;
- an inner body within said shell including at least one channel therethrough;
- a filter network within said one channel comprising a pair of hollow tubular filter elements including a ferrite filter element and a capacitance filter element, said elements being contiguous and axially aligned, an inner conductive coating on the interior surface of one of said elements and an outer conductive coating on the external surface of said capacitance element;
- a metal ground plate within said inner body having at least one aperture forming a portion of said channel, said ground plate having a pair of major surfaces and a substantial width dimension between said major surfaces for overlapping substantial portions of said elements and disposing one of said surfaces closely adjacent said outer conductive coating, said ground plate being electrically coupled to said shell and fixed to and electrically coupled to said outer conductive coating at said one major surface;
- an outer insulating sleeve surrounding said filter network for insulating said ferrite element from said ground plate; and
- a contact member within said filter network electrically coupled to said inner conductive coating.

14. A filter connector as defined in claim 13 wherein said capacitance filter element includes said inner conductive coating.

15. A filter connector as defined in claim 13 wherein said capacitance filter element comprises a multilayer capacitance filter element.

16. A filter connector as defined in claim 13 wherein said contact member includes an integral outer spring portion for contacting said inner conductive coating.

17. In a filter connector of the type which filters extraneous electrical signals such as electromagnetic interference and of the type including an outer metallic shell, a body within the shell having at least one channel therethrough, a contact member within the channel and a filter network which diverts the extraneous signals from the contact member to ground potential, a new and improved filter network and ground plate assembly for providing wide range extraneous signal protection while accommodating high RF currents and a high density contact array as well as providing a greatly reduced possibility of damage to the filter network during installation or removal of the contact member, said improvement comprising:

a plurality of contiguous and axially aligned tubular filter elements within the channel forming a tubular filter network adapted to contain the contact member therein, an inner conductive coating on the interior surface of at least one of said filter elements forming a network pin electrode adapted to electrically couple the contact member, and an outer conductive coating on the external surface of at least one of said filter elements forming a network ground electrode; and a conductive ground plate within the body having at least one aperture forming a portion of the body channel and having a substantial width dimension, taken parallel to the axes of said filter elements, of a magnitude at least as great as the axial length of any one of said tubular filter elements and being positioned closely adjacent to said ground electrode, said ground plate also being electrically coupled and mechanically fixed to said ground electrode to preclude relative movement of a network during installation or removal of the contact member.

18. A filter connector comprising:

an outer shell formed from conductive material;

an inner body including at least one channel therethrough;

a rigid ground plate within said inner body electrically coupled to said shell and including an aperture forming a portion of said channel;

a tubular filter network within said one channel having an outer ground electrode and a pin electrode, said ground plate being of an axial length so as to substantially envelope said filter network;

a deposit of conductive adhesive material between said ground electrode and said ground plate for electrically coupling said ground electrode to said ground plate and for fixing said network within said channel to preclude axial movement of said network within said channel; and a contact member adapted for sliding insertion into and removal from said filter network and including a contact portion for contacting said pin electrode.

19. A filter connector comprising:

an outer shell formed from conductive material;

an inner body including at least one channel therethrough;

a filter network within said one channel comprising a plurality of axially aligned and contiguous tubular filter elements, an inner conductive coating on the interior surface of at least one of said tubular filter elements, and an outer conductive coating covering an outer surface portion of at least one of said tubular filter elements;

a ground plate electrically coupled to said shell and also fixed to and electrically coupled to said outer conductive coating;

an outer insulating sleeve surrounding said filter network for insulating at least one of said filter elements from said ground plate; and a contact member within said filter network electrically coupled to said inner conductive coating.

20. A filter connector comprising:

an outer shell formed from conductive material;

an inner body including at least one channel therethrough;

a filter network within said one channel comprising three axially aligned and contiguous tubular filter elements including a center filter element and a pair of end filter elements, an inner conductive coating on the interior surface of at least one of said tubular filter elements, and an outer conductive coating covering an outer surface portion of at least one of said tubular filter elements;

a ground plate electrically coupled to said shell and also fixed to and electrically coupled to said outer conductive coating with the dimension of said ground plate corresponding to the axial length of said center filter element being greater than the axial length of said center filter element; and a contact member within said filter network electrically coupled to said inner conductive coating.

21. A filter connector as defined in claim 20 wherein said ground plate includes a pair of planar major surfaces, wherein each said end filter element includes an outer conductive coating and wherein each said outer conductive coating is closely adjacent a given one of said ground plate major surfaces.

22. A filter connector as defined in claim 21 wherein said outer conductive coatings are adhered to said ground plate major surfaces with conductive adhesive material.

23. A filter connector as defined in claim 22 wherein said conductive adhesive material is conductive epoxy.

24. A filter connector as defined in claim 23 wherein said center filter element comprises a ferrite filter element and wherein said end filter elements each comprise a capacitance filter element.

25. A filter connector as defined in claim 24 wherein said capacitance filter elements are multilayer capacitance filter elements.

* * * * *